United States Patent [19]

Nysen et al.

[11] Patent Number: 4,725,841
[45] Date of Patent: Feb. 16, 1988

[54] SYSTEM FOR INTERROGATING A PASSIVE TRANSPONDER CARRYING PHASE-ENCODED INFORMATION

[75] Inventors: Paul A. Nysen, Sunnyvale; Halvor Skeie, San Jose; Donald Armstrong, Belmont, all of Calif.

[73] Assignee: X-Cyte, Inc., Mountain View, Calif.

[21] Appl. No.: 509,523

[22] Filed: Jun. 30, 1983

[51] Int. Cl.⁴ ............ G01S 13/80; G01S 13/82; H04B 9/00

[52] U.S. Cl. .................. 342/44; 356/5; 455/604; 342/107

[58] Field of Search ......... 343/6.5 R, 6.5 SS, 6.5 LL, 343/6.8 R, 6.8 LL; 342/44, 51; 356/5; 455/604, 605, 610–612; 340/825.54

[56] References Cited

U.S. PATENT DOCUMENTS

| | | | |
|---|---|---|---|
| 3,273,146 | 9/1966 | Hurowitz | 343/6.8 R |
| 3,521,280 | 7/1970 | Janco et al. | 343/6.5 SS |
| 3,631,484 | 12/1971 | Avgenblick | 343/6.5 R |
| 3,706,094 | 12/1972 | Cole et al. | 343/6.8 R X |
| 3,737,911 | 6/1973 | Sakuragi et al. | 343/6.5 SS |
| 3,755,803 | 8/1973 | Cole et al. | 343/6.8 R X |
| 3,981,011 | 9/1976 | Bell, III | 343/6.5 SS |
| 4,023,167 | 5/1977 | Wahlstrom | 343/6.5 SS |
| 4,058,217 | 11/1977 | Vaughan et al. | 209/527 |
| 4,059,831 | 11/1977 | Epstein | 343/6.8 R |
| 4,069,472 | 1/1978 | Karata et al. | 343/6.5 SS |
| 4,151,525 | 4/1979 | Strauch et al. | 343/6.5 R |
| 4,217,564 | 8/1980 | Autran | 333/152 |
| 4,263,595 | 4/1981 | Vogel | 343/6.5 SS |
| 4,339,753 | 7/1982 | Mawhinney | 343/6.5 SS |
| 4,388,524 | 6/1983 | Walton | 343/6.5 R X |
| 4,620,191 | 10/1986 | Skeie | 342/51 X |
| 4,623,890 | 11/1986 | Nysen | 342/51 X |
| 4,625,207 | 11/1982 | Skeie | 342/51 X |

OTHER PUBLICATIONS

Davies et al., "Passive Coded Transponder Using an Acostic-Surface-Wave Delay Line", Apr. 1975, Electronic Letters, vol. 11, No. 8, pp. 163–164.

Primary Examiner—T. H. Tubbesing
Assistant Examiner—Gilberto Barrón, Jr.
Attorney, Agent, or Firm—Karl F. Milde, Jr.

[57] ABSTRACT

A "passive interrogator label system" (PILS) comprises an interrogator for transmitting an interrogation signal, one or more "labels" or passive transponders which produce a reply signal containing coded information in response to the interrogation signal, and a receiver and decoder for receiving the reply signal and decoding the information contained in it. The frequency of the interrogation signal assumes a plurality of frequency values within a prescribed frequency range. The decoder includes a mixer (4 quadrant multiplexer) for mixing together the interrogation and reply signals (or signals derived therefrom) to produce a further signal containing frequencies which are the sum and difference of the interrogation and reply signals. A signal processor, responsive to this further signal produced by the mixer, detects at least some of the frequencies contained in this further signal and determines the informational code associted with the transponder.

56 Claims, 24 Drawing Figures

SYSTEM FOR INTERROGATING A PASSIVE TRANSPONDER CARRYING PHASE-ENCODED INFORMATION

CROSS REFERENCE TO RELATED APPLICATIONS

The present application is related in subject matter to the following commonly owned applications for patent:

application Ser. No. 509,522, filed June 30, 1983, U.S. Pat. No. 4,623,890, for "Apparatus For Compensating Non-Linearities In A Frequency-Modulated Signal" of P. Nysen;

application Ser. No. 509,521, filed June 30, 1983, U.S. Pat. No. 4,605,929, for "Surface Acoustic Wave Passive Transponder Having Optimally-Sized Transducers" of H. Skeie;

application Ser. No. 509,525, filed June 30, 1983, U.S. Pat. No. 4,620,191, for "Surface Acoustic Wave Transponder Having Parallel Acoustic Wave Paths" of H. Skeie;

application Ser. No. 509,524, filed June 30, 1983, U.S. Pat. No. 4,609,623, for "Surface Acoustic Wave Passive Transponder Having Non-Reflective Transducers and Pads" of H. Skeie;

application Ser. No. 509,526, filed June 30, 1983, U.S. Pat. No. 4,625,207, for "Surface Acoustic Wave Passive Transponder Having Amplitude and Phase Modifying Surface Pads" of H. Skeie;

application Ser. No. 509,527, filed June 30, 1983, U.S. Pat. No. 4,625,208, for "Surface Acoustic Wave Passive Transponder Having Acoustic Wave Reflectors" of H. Skeie and P. Nysen.

BACKGROUND OF THE INVENTION

The present invention relates to a "passive interrogator label system" (PILS); that is a system comprising an interrogator for transmitting an interrogation signal, one or more "labels" or passive transponders which produce a replay signal containing coded information in response to the interrogation signal, and a receiver and decoding system for receiving the reply signal and decoding the information contained therein.

A passive interrogator label system of the type to which the present invention relates is disclosed in the U.S. Pat. No. 3,273,146 to Horwitz, Jr.; U.S. Pat. No. 3,706,094 to Cole and Vaughan; U.S. Pat. No. 3,755,803 to Cole and Vaughan; and U.S. Pat. No. 4,058,217 to Vaughan and Cole. In its simplest form, the systems disclosed in these patents include a radio frequency transmitter capable of transmitting RF pulses of electromagnetic energy. These pulses are received at the antenna of a passive transponder and applied to a piezoelectric "launch" transducer adapted to convert the electrical energy received from the antenna into acoustic wave energy in the piezoelectric material. Upon receipt of a pulse, an acoustic wave is generated within the piezoelectric material and transmitted along a defined acoustic path. Further "tap" transducers or reflectors arranged at prescribed, spaced intervals along this path, respectively, either (1) convert the acoustic wave back into electric energy or (2) reflect the acoustic wave back to the launch transducer for reconversion into electrical energy by the launch transducer. The presence or absence of tap transducers or reflectors at the prescribed locations along the acoustic wave path determines whether a reply pulse will be transmitted with a particular time delay, in response to an interrogation pulse. This determines the informational code contained in the transponder reply.

When an acoustic wave pulse is reconverted into an electrical signal it is supplied to an antenna on the transponder and transmitted as RF electromagnetic energy. This energy is received at a receiver and decoder, preferably at the same location as the interrogator transmitter, and the information contained in this response to an interrogation is decoded.

The transponder in a passive interrogator label system thus operates in the "time domain" to produce a reply signal containing one or more pulses of RF electromagnetic energy in response to the receipt of each single burst or pulse of RF electromagnetic energy. The presence and timing of the reply pulses relative to the transmitted, interrogation pulse determines the informational code contained in the reply.

Passive interrogator label systems of the above described type are subject to a number of disadvantages. The signal to noise performance of these systems is not easily improved since the systems are subject to both wide and narrow band interference. In addition, the systems require extensive signal processing of the transponder reply signal to evaluate and determine the informational code. This signal processing must normally be accomplished at the site of the receiver because the information is contained in a relatively wideband signal. Transmission to a remote, signal processing location would require wideband signal transmission.

SUMMARY OF THE INVENTION

An object of the present invention is to provide an interrogator-transponder system which requires the transmission of only low power interrogation signals.

It is a further object of the present invention to provide an interrogator-transponder system which has a high signal to noise ratio.

It is a further object of the present invention to provide an interrogator-transponder system having a signal decoder which is substantially simpler and less expensive than the decoders presently used in systems of this type.

These objects, as well as further objects which will become apparent in the discussion that follows, are achieved, according to the present invention, by providing apparatus for transmitting a first, interrogation signal having a first frequency which successively assumes a plurality of frequency values within a prescribed frequency range. This first frequency may, for example, be in the range of 905 to 925 MHz, a frequency band which is freely available in many parts of the world for short-range transmissions.

The remote transponder associated with the system according to the invention receives the first signal, as an input, and produces a second, reply signal as an output. Signal transforming means within the transponder convert the first signal to the second signal and include:

(1) A plurality of "signal conditioning elements" coupled to receive the first signal. Each signal conditioning element provides an intermediate signal having a known delay and a known amplitude modification to the first signal;

(2) a "signal combining element" coupled to all of the signal conditioning elements for combining the intermediate signals to produce the second signal.

The signal conditioning elements and the signal combining element impart a known informational code in the second signal which identifies and is associated with the particular passive transponder.

The system according to the invention further includes apparatus for receiving the second signal from the transponder and a mixer arranged to receive both the first signal and the second signal, or signals derived therefrom, for mixing together these two signals and thereby producing a further signal. This further signal may, for example, contain the sum and difference frequencies of the first and the second signals, respectively.

Finally, the system according to the invention includes a signal processor responsive to the further signal produced by the mixer for detecting the frequencies contained in that further signal and thereby to determine the informational code associated with the passive transponder.

The system according to the present invention has a number of advantages over the passive interrogator label system of the type disclosed in the U.S. Pat. Nos. 3,273,146 and 3,706,094, referred to above. The present system exhibits substantially improved signal to noise performance over the prior known system, in part because of a higher immunity to both narrow and wideband interference. The present system also does not require a complex signal processor to decode the informational code; rather, since the main processing of the signal is achieved in the radio frequency (RF) portion of the system, a conventional algorithm for Fourier analysis may be used in the signal processor.

Furthermore, the output of the mixer (referred to above) which mixes together the first (interrogating) signal and the second (reply) signal, or signals derived therefrom, may be transmitted over ordinary telephone lines since the frequency and bandwidth are in the audio range. Consequently, the signal processor may be located at a position quite remote from the RF interrogator/receiver and the mixer. This permits the utilization of a relatively expensive computer to perform the Fourier analysis for one or more remote interrogator/receivers without the necessity of expensive signal transmission capability from the remote location to the computer.

Finally, the RF technology utilized in the present system is substantially simpler than that of the prior known systems of this type since the radio frequency signals are directly used to carry the informational code. More specifically, the information is contained in the frequency and phase of the transponder reply signal (second signal) with respect to the interrogating signal (first signal).

The foregoing and other objects, features and advantages of the present invention will be apparent from the following, more particular description of the preferred embodiments of the invention is illustrated in the accompanying drawings.

DESCRIPTION OF THE PREFERRED EMBODIMENTS

Figure 1:
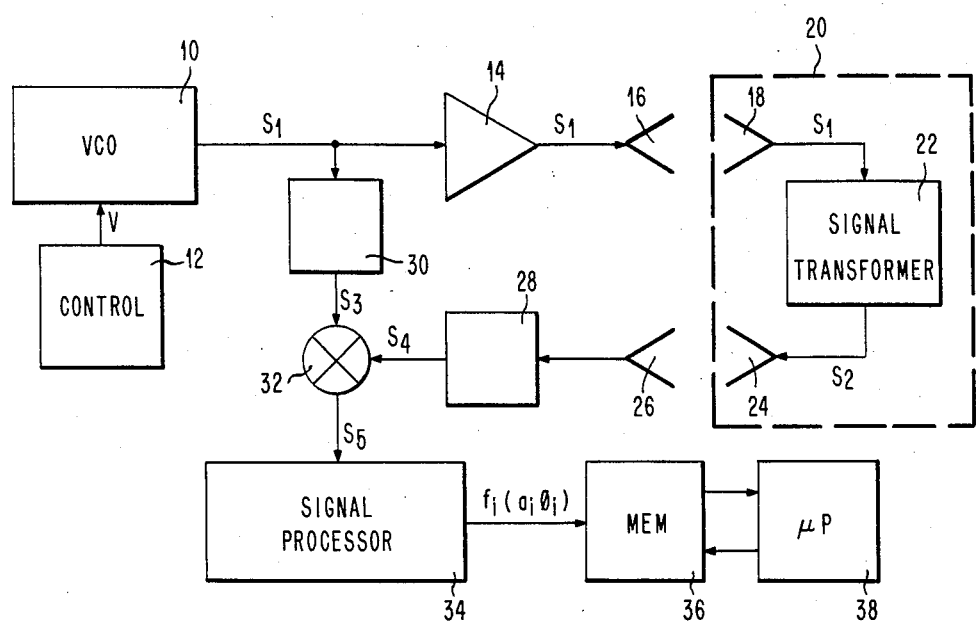
FIG. 1 is a block diagram of an interrogator-transponder system according to the present invention.

The preferred embodiments of the present invention will now be described with reference to FIGS. 1–24 of the drawings. Identical elements in the various figures are designated with the same reference numerals.

FIG. 1 shows the general configuration of the interrogator-transponder system according to the present invention. This system comprises a signal source, such as a voltage controlled oscillator 10, which receives a control signal V from a control element 12. The voltage V determines the frequency of the signal produced by the oscillator. This output signal of the oscillator is amplified by a power amplifier 14 and applied to an antenna 16 for transmission to a transponder. The transmitted signal is designated $S_1$.

The signal $S_1$ is received at an antenna 18 of the transponder 20 and is passed to a passive signal transforming element 22. This signal transformer converts the input signal $S_1$ into an output signal $S_2$ which is passed either to the same antenna 18 or to a different antenna 24 for transmission back to the interrogator/receiver apparatus.

The signal conversion performed by the signal transforming element 22 will be described in detail below in connection with FIG. 2. It suffices to say at this point that the signal $S_2$ carries an informational code which, at minimum, identifies the particular transponder 20.

The signal $S_2$ is received by an antenna 26 which may be the same or a different antenna from the transmitting antenna 16. This signal is then passed to a circuit element 28 which converts the signal $S_2$ into a signal $S_4$.

Similarly, the output of the VCO 10 is passed to a circuit element 30 which produces a signal $S_3$. These two signals $S_3$ and $S_4$ are applied to a mixer (four quadrant multiplier) 32.

The circuit elements 30 and 28 may or may not include means for modifying their respective input signals $S_1$ and $S_2$ to produce their respective output signals $S_3$ and $S_4$. For example, the element 30 may comprise merely an uninterrupted electrical circuit or wire so that the signal $S_3$ is a small signal version of the transmitted signal $S_1$. Similarly, the circuit element 28 may comprise merely an amplifier so that the signal $S_4$ is substantially identical to the signal $S_2$, but with higher signal level. Other variations of the circuit elements 30 and 28 will be described below. In general, however, the signal $S_3$ has been derived from, and therefore is a function of the frequency and phase of the signal $S_1$, whereas the signal $S_4$ is derived from and is therefore a function of the frequency and phase of the signal $S_2$.

The signals $S_3$ and $S_4$ are mixed or "heterodyned" in the mixer 32 to produce a signal $S_5$. This signal $S_5$ contains frequencies which are both the sum and the difference of the frequencies contained in the signal $S_3$ and $S_4$. The signal $S_5$ is passed to a signal processor 34 which determines, measures or detects at least some of the frequencies contained in the signal $S_5$. In particular, the signal processor 34 determines some of the difference frequencies $f_i$ in the signal $S_5$ has been sampled and these samples digitized. Preferably, the signal processor also determines the amplitude $a_i$ and the respective phase $\phi_i$ of the frequency component $f_i$, the phase $\phi_i$ being measured with respect to one of the frequency components $f_0$.

The information determined by signal processor 34 is passed to a microcomputer comprising a memory 36 and a microprocessor 38. This microcomputer continuously analyzes the frequency, amplitude and phase information and makes decisions based upon this information. For example, the microcomputer may determine the identity of the transponder 20.

Figure 2:
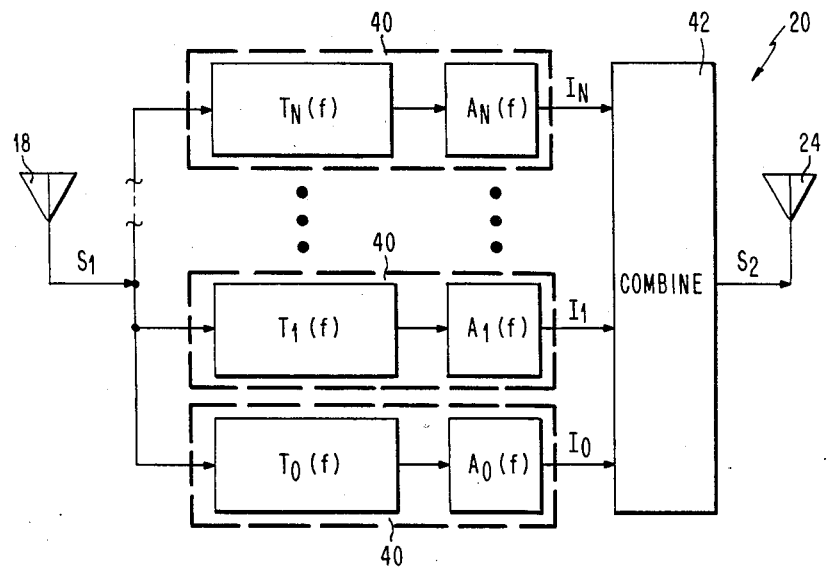
FIG. 2 is a block diagram of the transponder employed in the system of FIG. 1.

FIG. 2 illustrates the nature and operation of the transponder 20. This transponder may be an entirely passive device, or it may contain a power source and one or more active elements. As may be seen, the signal transforming element 22, indicated as a block in FIG. 1, comprises a number $N+1$ of signal conditioning elements 40 and a signal combining element 42. The signal conditioning elements 40 are each connected to the antenna 18 and receive the transmitted interrogation signal $S_1$. As may be seen, each signal conditioning element 40 produces a respective intermediate signal $I_0$, $I_1, \ldots I_N$ as an output. These intermediate signals are passed to the combining element 42 which combines these intermediate signals (e.g. by addition, multiplication and the like) to form the output signal $S_2$.

As may be seen in FIG. 2, each signal conditioning element 40 comprises a known delay $T_i$ and a known amplitude modification $A_i$ (either attenuation or amplification). The respective delay $T_i$ and amplitude modification $A_i$ may be functions of the frequency f of the received signal $S_1$, or they may provide a constant delay and constant amplitude modification, respectively, independent of frequency.

In the preferred embodiment of the invention, the delay elements $T_i$, amplitude modifying elements $A_i$ and the intermediate signal combining element 42 are strictly passive devices; that is, they require no power for their operation and provide no amplification of the processed signals. However, the principles and concepts of the present invention are applicable to active devices as well. As will be explained in detail below, the delay elements may be implemented by a device for generating, transmitting and receiving surface acoustic waves or by an optical fiber or optical wave guide for transmitting infra-red or light radiation. The amplitude modifying elements may comprise either resistive and/or reactive passive elements to attenuate the signal. As is apparent from FIG. 2, the order of the delay and the amplitude modifying elements may be reversed; that is, the amplitude elements $A_i$ may precede the delay elements $T_i$.

Figure 3:
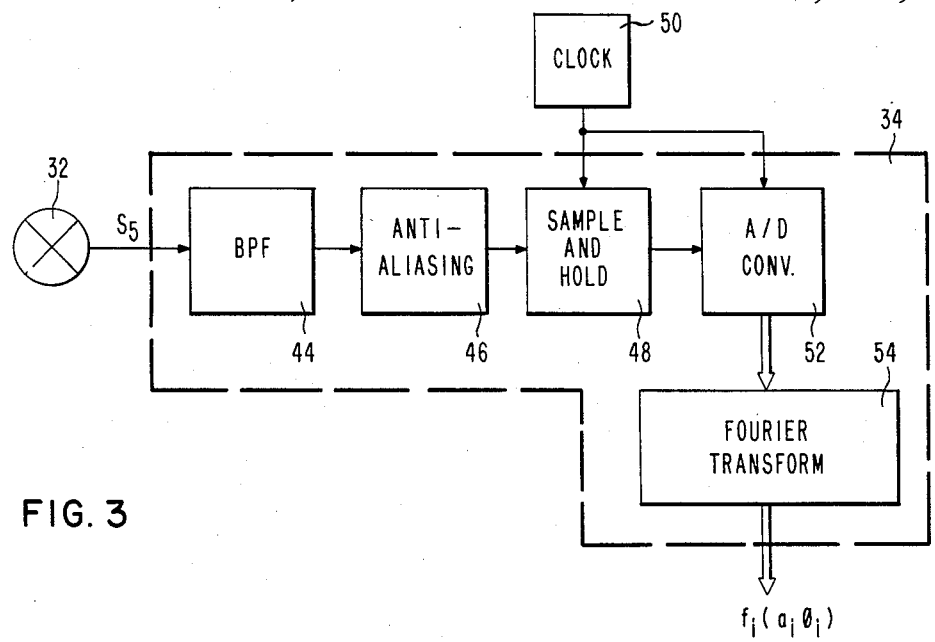
FIG. 3 is a block diagram of the signal processor employed in the system of FIG. 1.

FIG. 3 illustrates the signal processor 34 which determines some of the frequencies $f_i$ contained in the signal $S_5$. As may be seen, the signal $S_5$ is passed to a bandpass filter 44 having a pass band in the audio range (e.g. 1–3 KHz). This bandpass filter passes the portion of the signal $S_5$ containing the difference frequencies from the signals $S_3$ and $S_4$ while eliminating the extremely low frequency noise. The output of the bandpass filter is supplied through an anti-aliasing filter 46 to a sample-and-hold circuit 48. The analog signal is thus repetitively sampled at a sampling rate, determined by a clock 50, which is at least double the upper frequency of the bandpass filter 44. The sample-and-hold circuit maintains the sampled signal at its output for the interval between samples to permit digitization by an analog-to-digital converter 52. Finally, the digitized samples are passed from the A/D converter to a dedicated computer 54 which repetitively stores the samples produced for a prescribed interval and performs a Fourier transform on these signals. The computer 54 thus produces a digital output defining the frequencies $f_i$ contained in the original signal $S_5$. If desired, the computer 54 may also determine the respective amplitudes $a_i$ and phase $\phi_i$ of the signal $S_5$ at the respective frequencies $f_i$.

Figure 4:
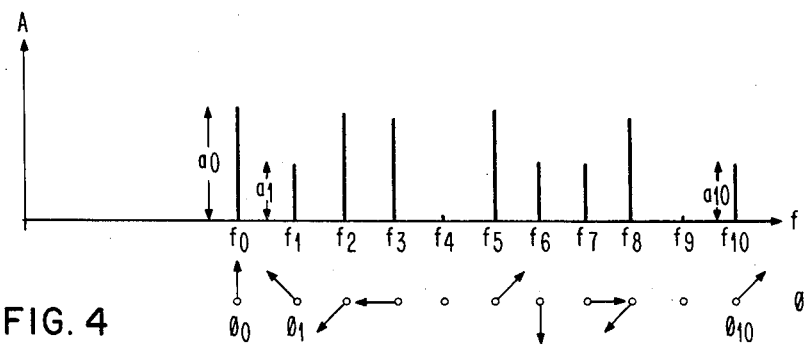
FIGS. 4 and 5 are frequency diagrams illustrating the type of information obtainable by the signal processor in the system of FIG. 1.
Figure 5:
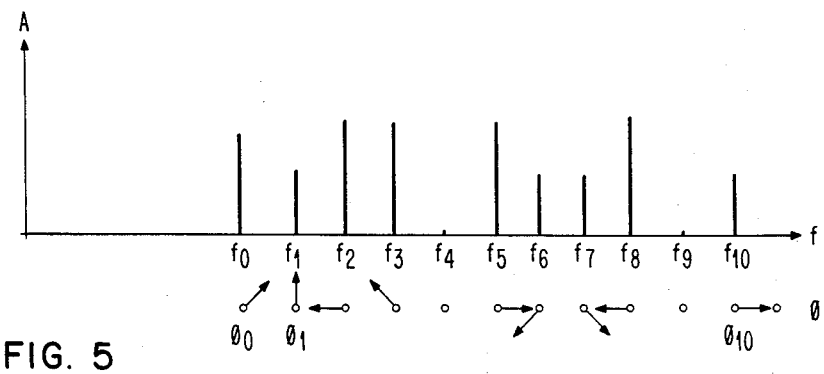

FIGS. 4 and 5 are frequency diagrams illustrating typical outputs of the signal processor 34. These outputs contain the infomational code imparted by the signal transformer 22 of the transponder 20, and thus identify the particular transponder associated with this code.

Reverting back for a moment to the apparatus of FIG. 1, it is assumed that the VCO 10 is controlled in such a way that the frequency of the signal $S_1$ successively assumes a plurality of frequency values within a prescribed frequency range. For example, the control voltage V may ramp upward or downward between a minimum and maximum voltage to provide a continuous frequency sweep between the limits of the prescribed frequency range. In the alternative, the voltage V may be stepped from one value to the next between a minimum and a maximum voltage so that the signal $S_1$ assumes a plurality of discrete frequency values within a prescribed frequency range. This frequency range may advantageously be 905 to 925 MHz, a frequency band which is freely available throughout the world for short range transmissions.

Assuming that the signal $S_1$ successively takes on a plurality of frequency values, the output of the signal processor will take the form illustrated in FIGS. 4 and 5. As shown in FIG. 4, the signal $S_5$ contains a number of discrete frequencies $f_0, f_1, f_2 \ldots f_{10}$ having different amplitudes (magnitudes) $a_0, a_1 \ldots a_{10}$ and phases $\phi_0, \phi_1 \ldots \phi_{10}$ (the phases $\phi_1 \ldots \phi_{10}$ of the frequencies $f_1 \ldots f_{10}$ being all taken relative to the phase $\phi_0$ of the frequency $f_0$).

Since the measured phases $\phi_0 \ldots \phi_{10}$ depend upon the distance of the transponder from the transmitter and receiver, movement of the transponder in the radial direction either toward or away from the transmitter and receiver antenna may be determined by repetitive measurements of the respective phases. FIG. 5 illustrates how the phases $\phi_0 \ldots \phi_{10}$ have been rotated (by 45°, as an example) compared to the respective phases in FIG. 4 due to a difference in range from the transmitter/receiver to the transponder compared to the phases in FIG. 4.

The difference frequencies contained in the signal $S_5$ depend upon the frequencies contained in the transmitted signal $S_1$ as well as upon the nature of the transponder.

Figure 6:
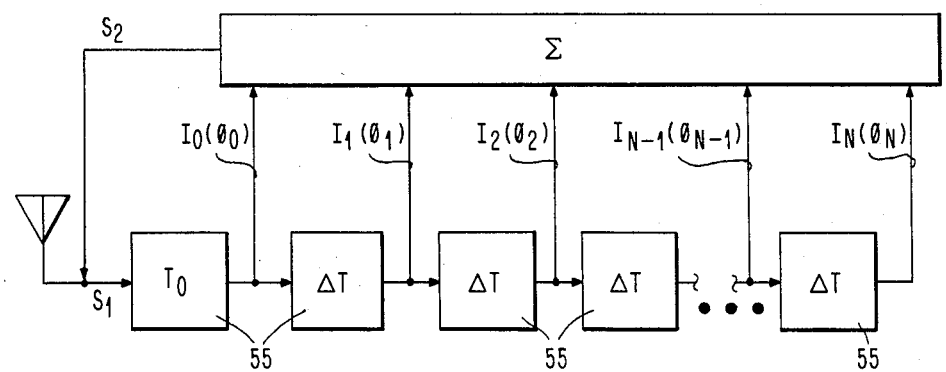
FIG. 6 is a block diagram of a passive transponder according to one preferred embodiment of the present invention.

Assume that the VCO 10 is controlled to provide a linear sweep in frequency. Assume also that the transponder is implemented such that the signal transforming element may be modelled as a transversal filter as shown in FIG. 6. This filter has an initial delay of $T_0$ and successive equal delays of $\Delta T$. The output from each delay element 55 is subjected to a phase shift $\phi_i$ (i=0 to N). The phase difference $\phi_i - \phi_{i-1}$, is constrained to have one of the four values 0, ±90° or 180° at the center frequency (915 MHz). The code information of the transponder is carried in these phase differences. It is the purpose of the system to retrieve the pattern of phase differences as the unique identification of the particular transponder.

The output signals $I_0 \ldots I_N$ (intermediate signals) from each delay element are summed together to form the signal $S_2$. This signal $S_2$ is supplied to the common antenna of the transponder. Assume further that the signals $S_3$ and $S_4$ in the system are related in frequency and phase (though not in amplitude) to the signals $S_1$ and $S_2$, respectively, at the transmitter and receiver, respectively. When the reply signal $S_4$ is mixed against the transmitted signal $S_3$ in the mixer 32, beat notes are generated because of the delays in the transponder. In fact, each intermediate signal $I_0 \ldots I_N$ produces its own unique beat frequency. By comparing the phases of adjacent beat frequencies, it is possible to recover the information that was phase-encoded in the transponder.

Assume, therefore, that the VCO frequency is swept at a constant rate $\dot\omega$ in radians per second from a minimum frequency $\omega_0$ to a maximum frequency $\omega_0 + \Delta\omega$, where $\omega = 2\pi f$ radians. The time to accomplish this sweep is $\tau = \Delta\omega/\dot\omega$.

The signal $S_1$ may be represented as a frequency-modulated cosine wave:

$$S_1(t) = \cos(\omega_0 t + \tfrac{1}{2}\dot\omega t^2)$$

whose instantaneous frequency is $\omega_0 + \dot\omega t$. The initial phase may be set to zero; this is merely a question of arbitrary choice of the time origin. The amplitude may be taken as unity.

Sweep duration is necessarily finite, but that constraint is ignored in this analysis. There are "end effects" produced by the finite sweep duration but the essential operation of the system is most clearly seen by neglecting these end effects.

The intermediate signal $I_i$ of the transponder has the same form as the transmitted signal $S_1$ except:

(1) It is delayed by $T_c + T_o + i\Delta T$, where $T_c$ is the round trip propogation time from and transmitter to transponder to receiver;
(2) It is phase shifted by $\theta_i$; and
(3) Its amplitude is reduced to A (the same for all intermediate signals).

Therefore, the composite reply signal $S_2$ is given by $$S_2(t) = A \sum_{i=0}^{N} S_1(t - T_c - T_o - i\Delta T)\theta_i$$

$$= A \sum_{i=0}^{N} \cos\{\omega_0(t - T_c - T_o - i\Delta T) +$$

$$\tfrac{1}{2}\dot\omega(t - T_c - T_o - i\Delta T)^2 + \theta_i\}.$$

Next, the useful output of the mixer 32 may be represented as the difference-frequency component of the product $$S_5(t) = S_1(t) \times S_2(t)$$

After clearing the algebra, this expression gives $$S_5(t) = A \sum_{i=0}^{N} \cos\{\dot\omega t(i\Delta T + T_c + T_o) + \omega_0(i\Delta T + T_c + T_o) -$$

$$\tfrac{1}{2}\dot\omega(T_c^2 + T_o^2 + (i\Delta T)^2 + 2T_c T_o + 2i\Delta T(T_c + T_o)) - \theta_i\}.$$

This will be recognized as an (N+1)-line comb spectrum in which the ith frequency line has amplitude A, an instantaneous frequency $\dot\omega (i\Delta T + T_c + T_o)$, and an involved phase denoted $\phi_i$.

If a spectrum analysis is performed on the signal of $S_5(t)$ in such manner that the many frequency lines do not interfere with one another, then the amplitude A and phase $\phi_i$ can be retrieved for each line separately. (Actually, a Fourier analysis delivers the Cartesian coordinates of each line; further processing is needed to convert to polar form and obtain the phase $\phi_i$.)

FIGS. 4 and 5 illustrate how the phases $\phi_i$ change as a result of a change in the propagation delay $T_c$. Thus, by calculating the phases $\phi_i$ of the frequency lines at different times, and by comparing the respective results of subsequent calculations, it is possible to determine if the transponder has moved radially with respect to the transmitting and receiving system. This comparison may be effected in a straightforward manner by a suitable program for the microprocessor 38.

Figure 7:
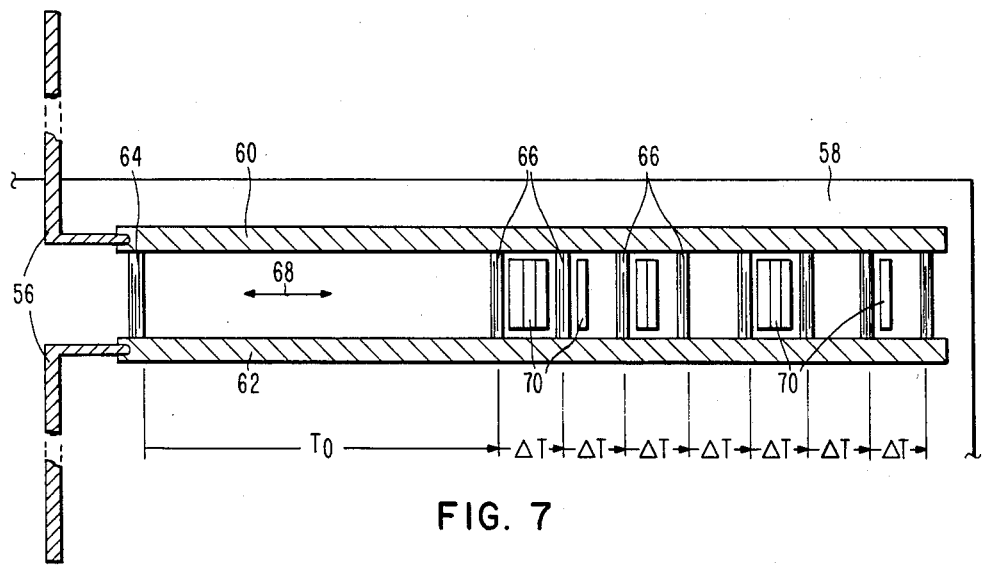
FIG. 7 is a representational diagram of an implementation of the embodiment of FIG. 6.

FIG. 7 illustrates a particular transponder of the general type disclosed in the U.S. Pat. No. 3,706,094 to Cole and Vaughan which operates to convert the received signal $S_1$ into an acoustic wave and then to reconvert the acoustic energy back into an electrical signal $S_2$ for transmission via a dipole antenna 56. More particularly, the signal transforming element of the transponder includes a substrate 58 of piezoelectric material such as a lithium niobate ($LiNbO_3$) crystal. On the surface of this substrate is deposited a layer of metal, such as aluminum, forming a pattern such as that illustrated in FIG. 7. For example, this pattern may consist of two bus bars 60 and 62, connected to the dipole antenna 56, a launch transducer 64 and a plurality of "tap" transducers 66. The bars 60 and 62 thus define a path of travel 68 for acoustic waves which are generated by the launch transducer and propagate substantially linearly, reaching the tap transducers each in turn. The tap transducers convert the acoustic wave back into electrical energy which is collected and therefore summed by the bus bars 60 and 62. This electrical energy then activates the dipole antenna 56 and is converted into electromagnetic radiation for transmission as signal $S_2$.

In the acoustic wave transponder disclosed in the U.S. Pat. No. 3,706,094 to Cole and Vaughan, the presence or absence of tap transducers at the respective, equidistant tap transducer positions provides the informational code in the transmitted reply signal. Thus, a single pulse or burst of RF energy transmitted to the transponder (first signal $S_1$) will result in one or more reply pulses (second signal $S_2$) depending upon the presence or absence of tap transducers in the acoustic wave device.

Figure 8:
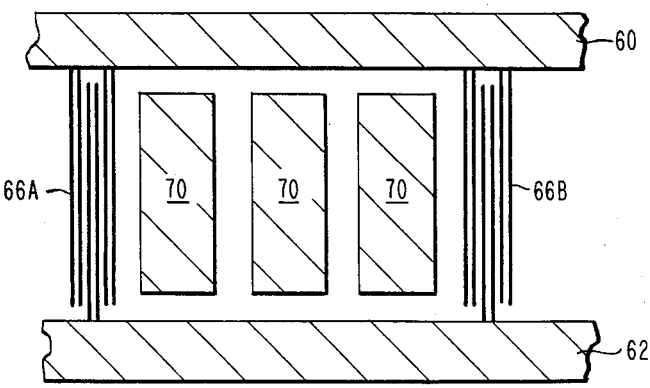
FIG. 8 is a representational diagram, in enlarged scale, of a portion of the implementation shown the FIG. 7.

In a preferred embodiment of the present invention, the tap transducers 66 are always provided at equally spaced intervals along the acoustic wave path 68, as shown in FIG. 7, and the informational code is imparted by providing a selected number of "delay pads" 70 between the tap transducers. These delay pads, which are shown in detail in FIG. 8, are preferably made of the same material as, and deposited together with the bus bars 60, 62 and the transducers 64, 66. Each delay pad has a width sufficient to delay the propagation of the acoustic wave from one tap transducer 66 to the next by a quarter cycle or 90° with respect to an undelayed wave at the frequency of operation (circa 915 MHz). By providing locations for three delay pads between successive tap transducers, the phase $\phi$ of the acoustic wave received by a tap transducer 66B, with respect to the time that this wave passes beneath the previous tap transducer 66A, may be controlled to provide four phase possibilities:

1. No pads between tap transducers 66A and 66B = −90°;
2. One pad between tap transducers 66A and 66B = 0°;
3. Two pads between tap transducers 66A and 66B = 90°; or
4. Three pads between tap transducers 66A and 66B = 180°

Referring to FIG. 6, the phase information $\phi_0$ (the phase of the signal picked up by the first tap transducer in line), and $\phi_1, \phi_2 \ldots \phi_N$ (the phases of the signals picked up by the successive tap transducers) are supplied to the combiner (summer) which in the embodiment of FIG. 7 comprises the bus bars 60 and 62. This phase information, which is transmitted as the signal $S_2$ by the antenna 56, contains the informational code of the transponder.

Figure 9:
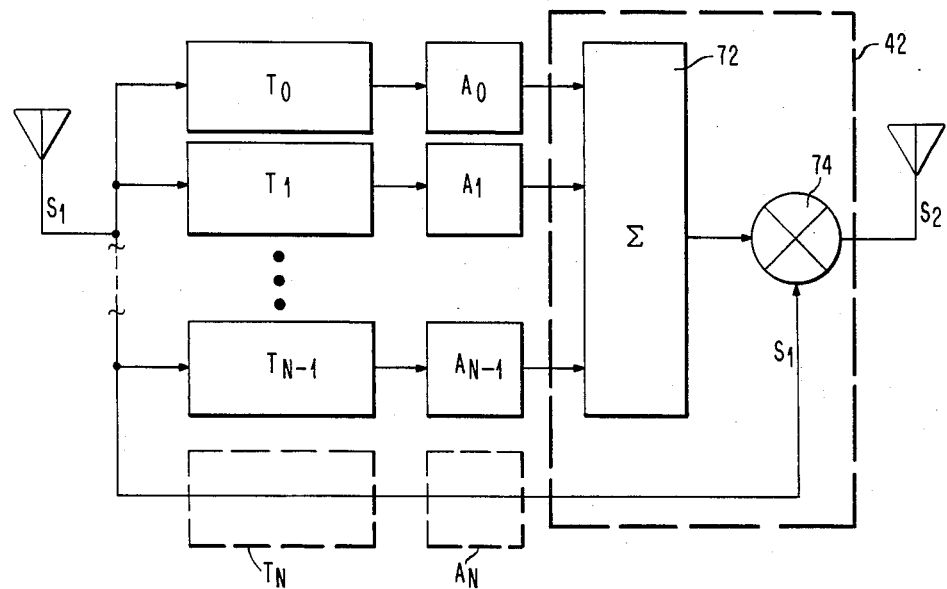
FIG. 9 is a block diagram of a passive transponder according to another preferred embodiment of the present invention.

FIG. 9 illustrates still another form of transponder which falls within the general class of transponders illustrated in FIG. 2. In this case the combining element 42 includes a summing device 72 as well as a mixer 74. In this case also, the known delay $T_N = 0$ and the known amplitude modification $A_N = 1$.

The effect of mixing (heterodyning) the received signal $S_1$ with the output signal from the summing device 72 is to effectively double the frequency of the output signal $S_2$. The output of the mixer 74 will contain both the sum and difference frequencies of its two inputs, both of which are at the frequency of the signal $S_1$. If the antenna is tuned to radiate primarily the sum frequency, and not the difference frequency, the transmitted (radiated) signal $S_2$ will have twice the frequency of the signal $S_1$. The system receiver will therefore be tuned to receive a frequency which is an octave above the frequency of the transmitter, making it possible both to transmit the signal $S_1$ and receive the signal $S_2$ simultaneously. This arrangement overcomes the problem of clutter or echo from objects which reflect the transmitted signal $S_1$.

Figure 10:
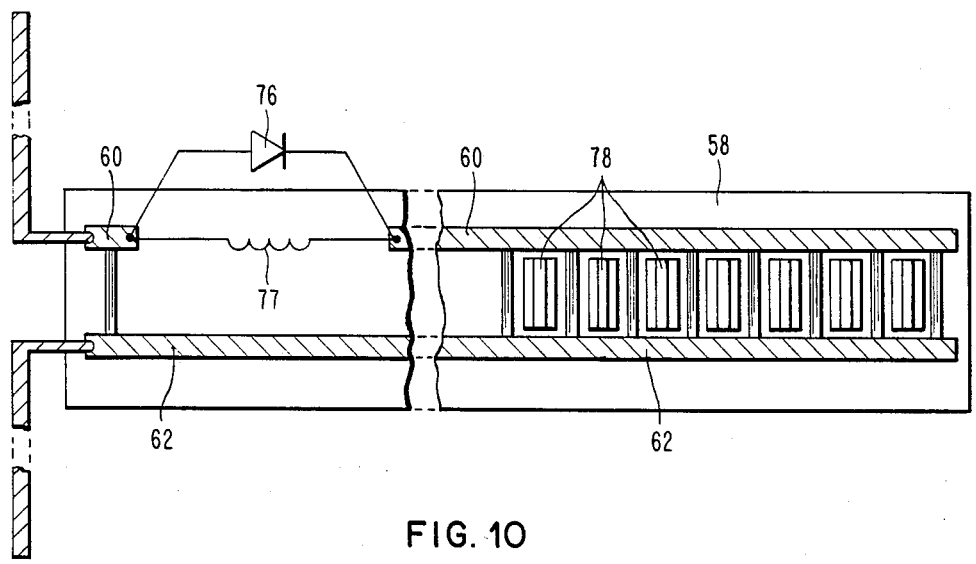
FIG. 10 is a representational diagram of an implementation of the embodiment of FIG. 9.
Figure 11:
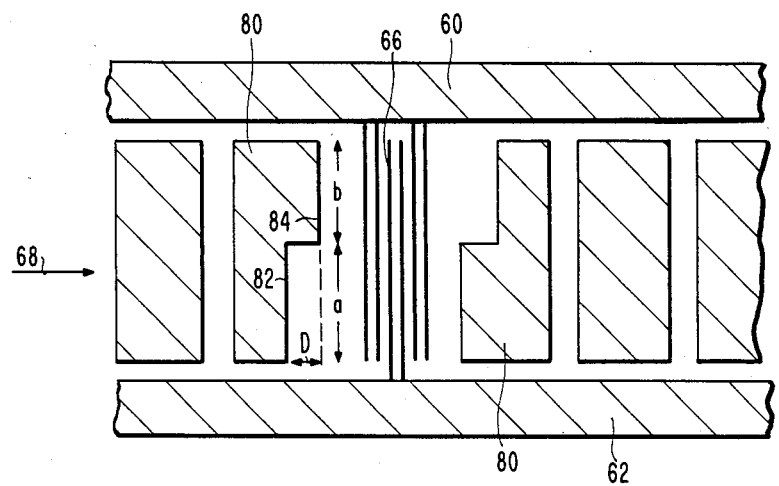
FIG. 11 is a representational diagram showing a detail of the standing acoustic wave device utilized in the implementation of FIG. 10.

FIGS. 10 and 11 illustrate an acoustic wave device which implements the transponder of FIG. 9. This device comprises the usual bus bars 60 and 62 on the piezoelectric substrate 58. The busbar 60 is split at one point and a diode 76 and RF choke 77 are connected across the gap to provide a single unbalanced mixer which doubles the frequency of the output signal $S_2$.

In this embodiment the delay pads 78 take the form shown in FIG. 11 which provide not only a phase delay but also a selected attenuation (amplitude modulation) of the acoustic wave. This arrangement offers an additional means of encoding; that is, the code may be comprised of amplitude as well as phase information.

Referring to FIG. 11, the delay pads inserted between tap transducers 66 include specially designed amplitude modifying pads 80. The pads 80 have a notched edge perpendicular to the path of travel 68 of the standing acoustic waves; this notched edge thus presents to the waves two edge surfaces 82 and 84. The edge 82 has a length "a" whereas the edge 84 has a length "b". The edge 82 extends parallel to the edge 84 a distance D away, such that the difference in delay provided by the pad at the two edges 82 and 84, respectively is 180°. With this constraint, the portion of the wave crossing the edge 82 is out of phase with the portion of the wave crossing the edge 84, thus providing cancellation.

The attenuation W may be calculated by comparing the relative edge lengths a and b:

$$W = (a-b)/(a+b).$$

In the case where the length $b = 0$, there is no attenuation ($W = 1$). In the case where $a = b$, there is a maximum attenuation ($W = 0$).

Figure 12:
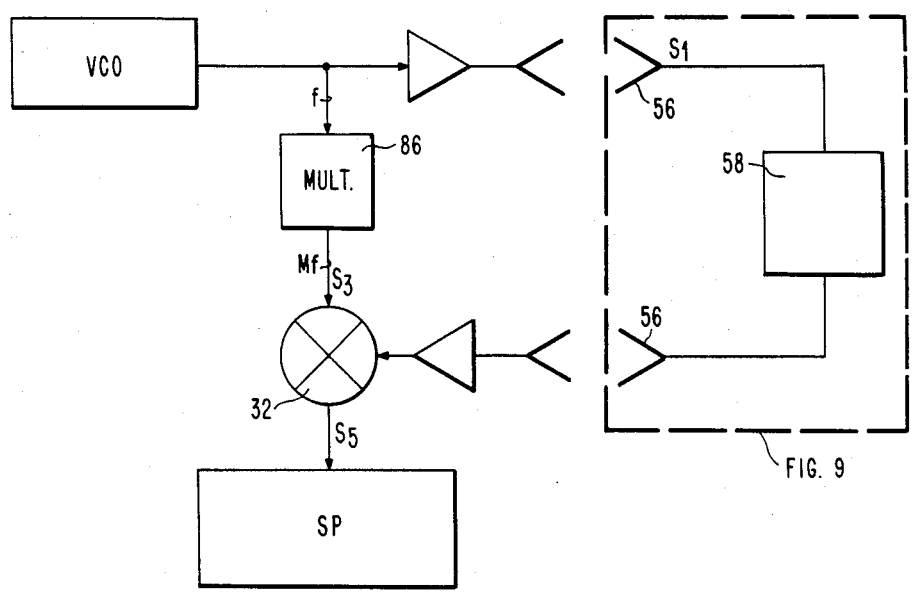
FIG. 12 is a block diagram of one preferred embodiment of the interrogator/receiver apparatus of FIG. 1.

Since the frequency of the signal $S_2$ transmitted by the transponder of FIG. 9 is twice the frequency of the signal $S_1$, the decoding system must be accordingly modified. FIG. 12 illustrates a portion of the system shown in FIG. 1 having a frequency multiplier (e.g. doubler) connected to the output of the VCO 10 to provide a signal $S_3$ having a frequency Mf which is a multiple (e.g. twice) the frequency f of the signal produced by the VCO. The signal $S_3$, which is then mixed with the amplified signal $S_2$ received from the transponder, has a frequency closely approximating the frequency of the signal $S_2$.

Figure 13:
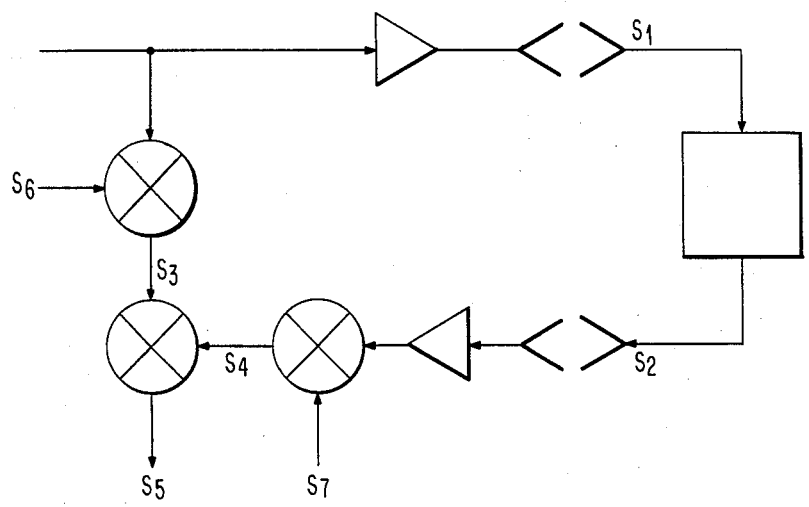
FIG. 13 is a block diagram of another preferred embodiment of the interrogator/receiver apparatus of FIG. 1.

FIG. 13 illustrates still another variation of the decoding system according to the present invention. In this case, the signals $S_3$ and $S_4$ are produced by heterodyning with separately generated signals $S_6$ and $S_7$, respectively. The signals $S_6$ and $S_7$ must be either the same signal or related, synchronized signals to produce synchronized outputs $S_3$ and $S_4$.

The configuration shown in FIG. 13 may serve to lower the frequencies of the signals $S_3$ and $S_4$ thereby to facilitate the system design.

Figure 14:
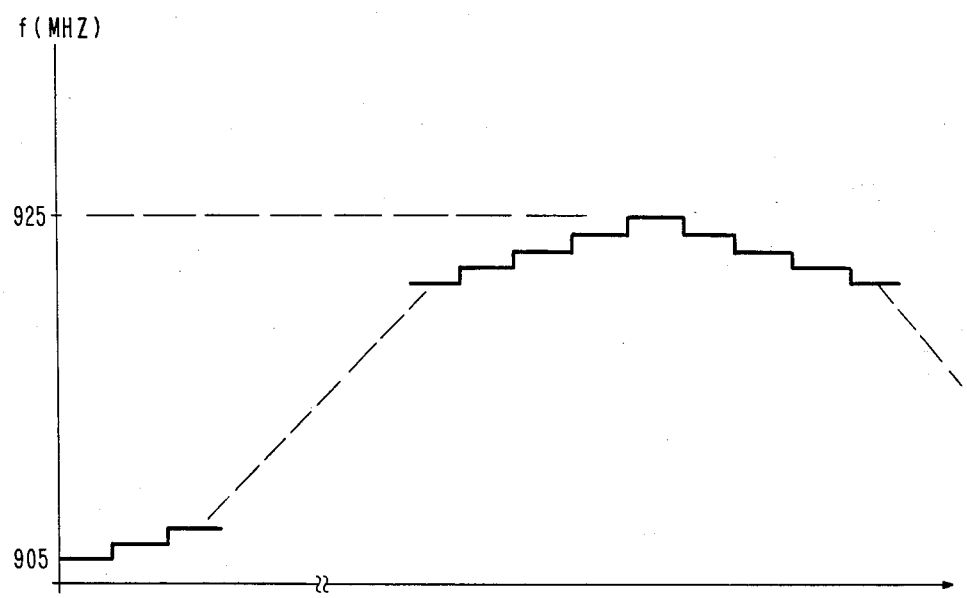
FIG. 14 is a frequency versus time diagram illustrating one preferred form of frequency variation in the system of FIG. 1.

FIG. 14 shows how the frequency f of the signal produced by the VCO in the apparatus of FIG. 1 may be changed in steps within a prescribed frequency range (905–925 MHz). In this example, the control unit 12 provides a staircase voltage V to the VCO 10 so that the frequency f is staircased up from the minimum frequency 905 MHz in 128 equal steps to the maximum frequency 925 MHz. After reaching 925 MHz, this frequency is staircased down again in 128 steps and the process is repeated.

Figure 15:
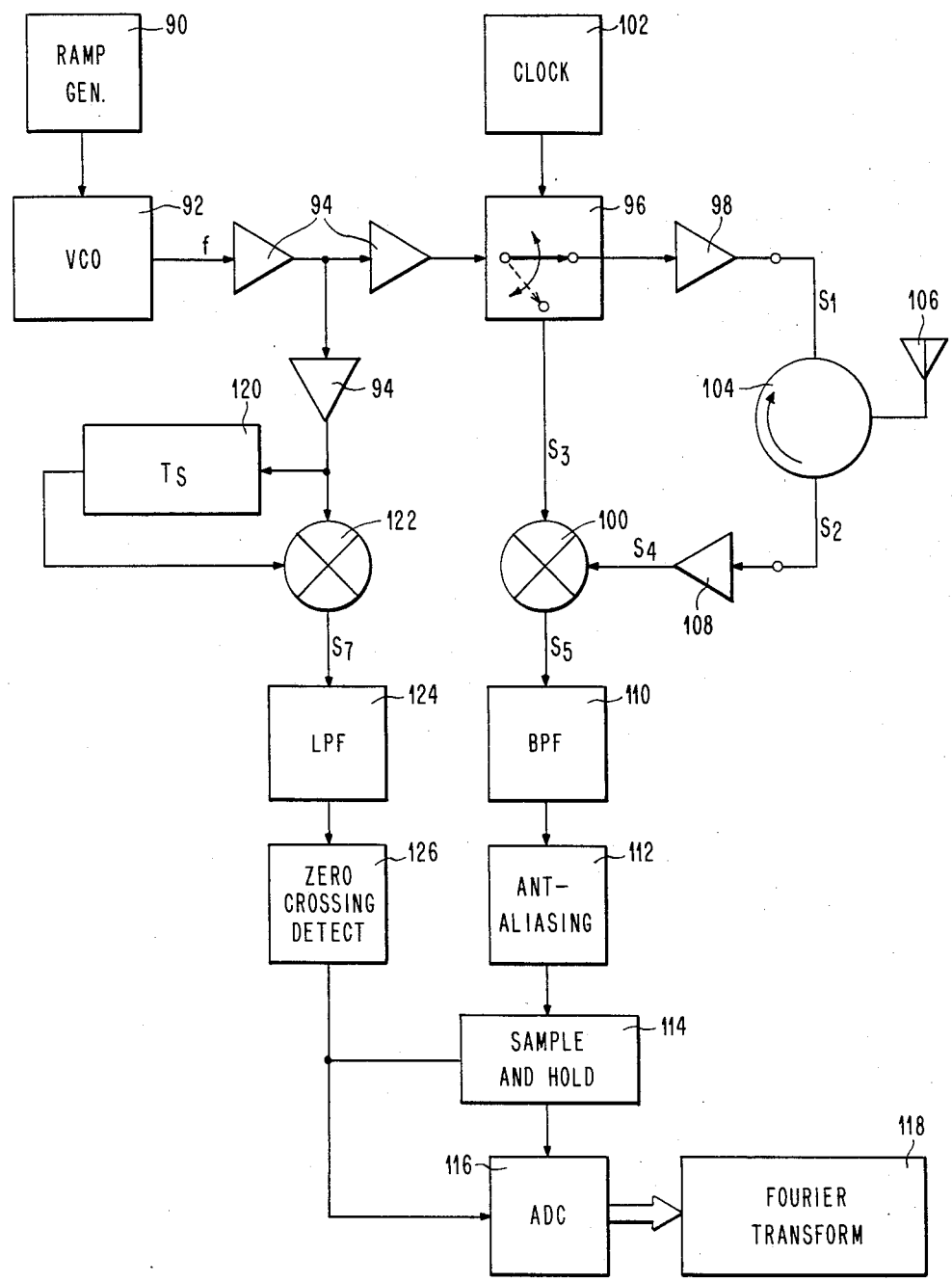
FIG. 15 is a detailed block diagram of one preferred embodiment of the interrogating, receiving and decoding portion of the system according to the present invention.

FIG. 15 illustrates the apparatus of FIG. 1 again with three additional features:

1. A ramp or sawtooth signal generator for varying the frequency of the VCO;
2. A clock generator and switch for switching back and forth between transmit and receive modes; and
3. A synchronized pulse generator for selecting sampling times and thereby compensating for non-linearities in the frequency sweep.

The system of FIG. 15 has a ramp generator 90 which supplies a sawtooth waveform to a VCO 92. The VCO produces an output signal of frequency f which repeatedly ramps linearly upward from a frequency of 905 MHz to a frequency of 925 MHz. This signal is amplified by RF amplifiers 94 and supplied to a transmit-receive switch 96 that directs the signal either to a transmit power amplifier 98 or to a decoding mixer 100. The switch 96 is controlled by a 100 KHz square wave signal produced by a clock 102. The output signal $S_1$ from the power amplifier 98 is supplied to an external circulator or transmit/receive (TR) switch 104 and transmitted as electromagnetic radiation by the antenna 106.

The transponder reply signal $S_2$ is received by the antenna 106 and passed through the circulator or TR switch 104 to a receiver amplifier 108. The output $S_4$ of this amplifier is mixed with the signal $S_3$ intermittently presented by the switch 96.

The output $S_5$ of the mixer 100, which contains the sum and difference frequencies of the signals $S_3$ and $S_4$ is supplied to a band-pass filter 110 with a pass band between 1 and 3 KHz. The output of this filter is passed through an anti-aliasing filter 112 to a sample-and-hold device 114.

The sample-and-hold device supplies each sample to an analog-to-digital converter 116. This A/D converter, in turn, presents the digital value of this sample to an element 118 that analyzes the frequencies contained in the signal by means of a fast Fourier transform. The sample-and-hold device 114 and the A/D converter 116 are strobed by a sampling signal derived from the signal produced by the VCO 92. This sampling signal serves to compensate for the non-linearity, with respect to time, in the monotonically increasing frequency f of the VCO output signal.

As shown in FIG. 15, the signal produced by the VCO 92 is amplified and passed through a delay element 120 with a constant signal delay $T_s$. Both the delayed and the undelayed signal are applied to a mixer 122 which produces a signal $S_7$ containing both sum and difference frequencies. The signal $S_7$ is supplied to a low-pass filter 124 which passes only the portion of this signal containing the difference frequencies. The output of the low pass filter is applied to a zero crossing detector 126 which produces a pulse at each positive (or negative) going zero crossing. These pulses are used to strobe the sample and hold device 114 and A/D converter 116.

Figure 16:
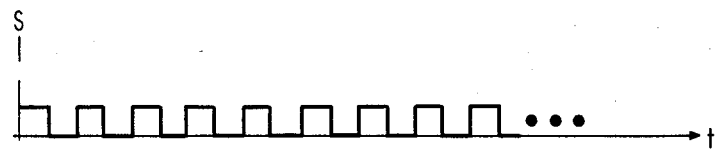
FIG. 16 is a timing diagram indicating the clock output in the apparatus of FIG. 15.
Figure 17:
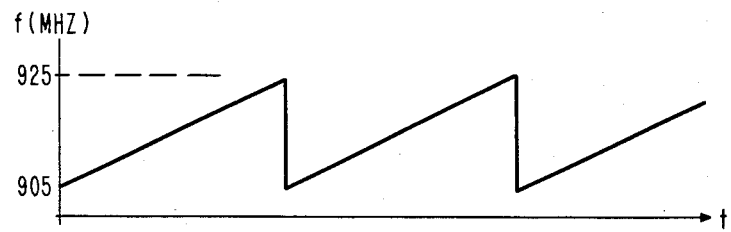
FIG. 17 is a frequency vs. time diagram illustrating the transmitted signal in the apparatus of FIG. 15.
Figure 18:
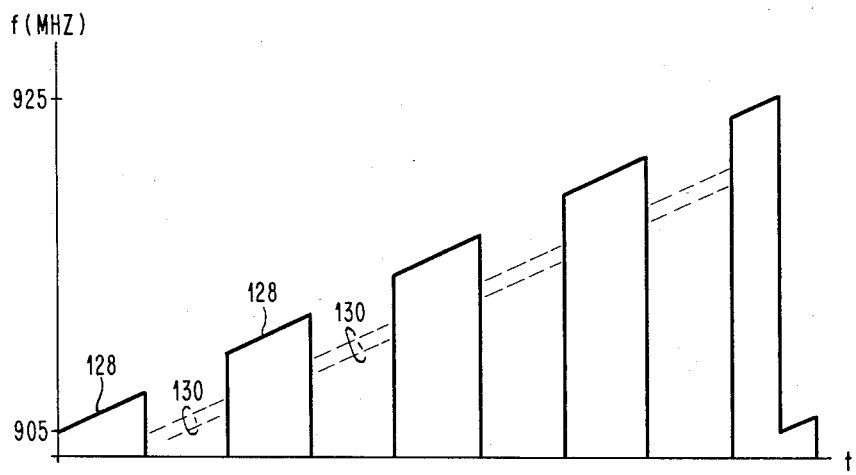
FIG. 18 is a frequency vs. time diagram illustrating both the transmitted and received signals in the apparatus of FIG. 15.

FIGS. 16–18 illustrate the operation of the circuit of FIG. 15. FIG. 16 shows the 100 KHz output of the clock 102; FIG. 17 shows the frequency sweep of the signal produced by the VCO 92. FIG. 18 shows, in solid lines 128, the frequency of the transmitted signal $S_1$ and, in dashed lines 130, the frequency of the signal $S_2$ received from the transponder. As may be seen, the signal 130 is received during the intervals between transmissions of the signal 128. These intervals are chosen to be, approximately equal to the round trip delay time between the transmission of the signals to the transponder and the receipt of the transponder reply signal $S_2$. As indicated by the multiple dashed lines, the transponder reply will contain a number of frequencies at any given instant of time as a result of the combined (e.g. summed) intermediate signals having different delay times ($T_0$, $T_1 \ldots T_N$).

Figure 19:
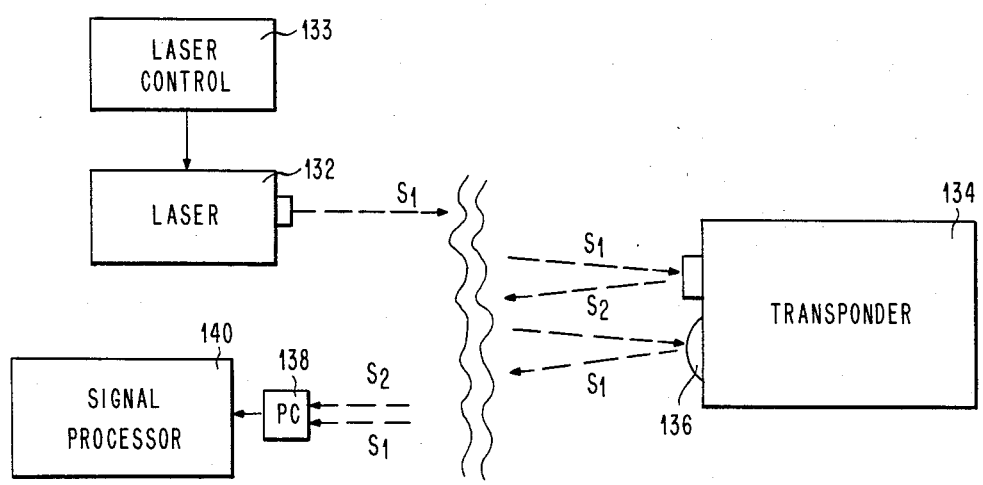
FIG. 19 is a block diagram of the transmitter and receiver for an interrogator-transponder system according to the present invention which operates with infrared or light radiation.

FIGS. 19–22 illustrate further preferred embodiments of the present invention which utilize radiation produced by a laser. As is illustrated in FIG. 19, a laser 132 is excited and produces radiation at a succession of different frequencies (e.g., in the infrared and/or in the visible light spectrum) in response to a control system. This radiation forms the signal $S_1$ which is transmitted to the transponder 134. The transponder 134 receives the signal $S_1$ and (1) produces a reply signal $S_2$ in response to the signal $S_1$ and (2) reflects the signal $S_1$ by means of a mirror 136. The reflected signal $S_1$ as well the reply signal $S_2$ are received by a photocell (PC) 138 which converts these radiation signals to an electrical signal. The output of the photocell 138, which contains the difference frequency of the signals $S_1$ and $S_2$, is supplied to a signal processor 140 of the type illustrated in FIG. 1.

Figure 20:
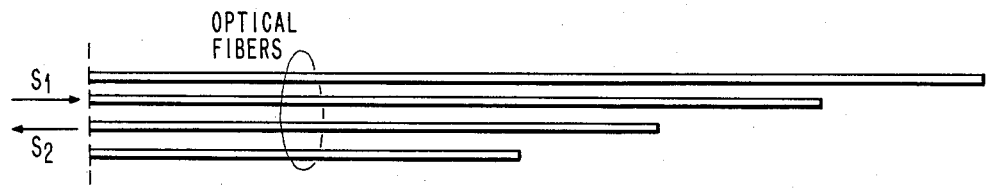
FIG. 20 is a representational diagram of one preferred embodiment of a passive transponder for use with the system of FIG. 19.
Figure 21:
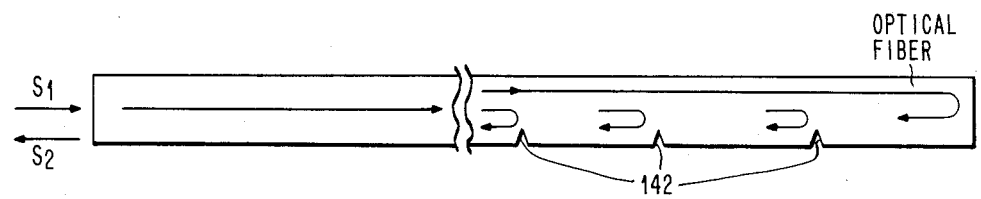
FIG. 21 is a representational diagram of another preferred embodiment of a passive transponder for use with the system of FIG. 19.
Figure 22:
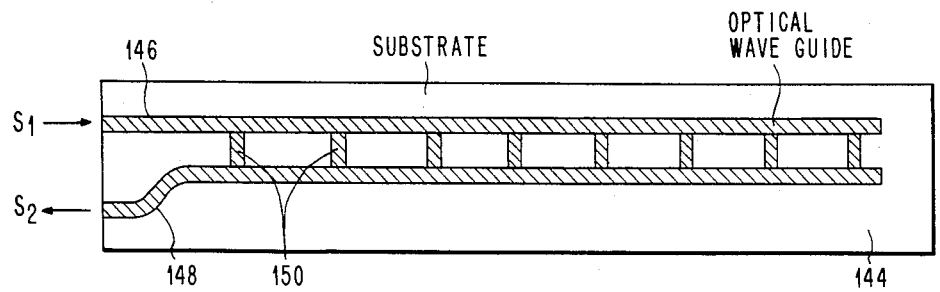
FIG. 22 is a diagram of a third preferred embodiment of a passive transponder for use with the system of FIG. 16.

The transponder 134 for the interrogating, receiving and decoding system shown in FIG. 19 may take one of the forms illustrated in FIGS. 20, 21 and 22. In FIG. 20, there are shown a plurality of optical fibers of different lengths which receive the signal $S_1$ and transmit a reflection signal $S_2$. The signal $S_2$ will thus comprise a sum of the signals emanating from all the fibers. With this arrangement, each fiber receives the signal $S_1$, conducts it from one end, reflects it and conducts it back again to the receiving end.

In the embodiment of FIG. 21 a single optical fiber is employed to produce the signal $S_2$. In this case, a number of taps or notches 142 in the fiber serve to reflect portions of the radiation back toward the receiving end.

FIG. 22 illustrates an optical waveguide comprising an integrated optic delay line doped into an optical substrate 144. This waveguide consists of a receiving guide 146, a transmitting guide 148, and a plurality of taps 150 between the receiving guide and transmitting guide. This optical waveguide thus operates in a manner quite similar to the notched optical fiber shown in FIG. 21.

Figure 23:
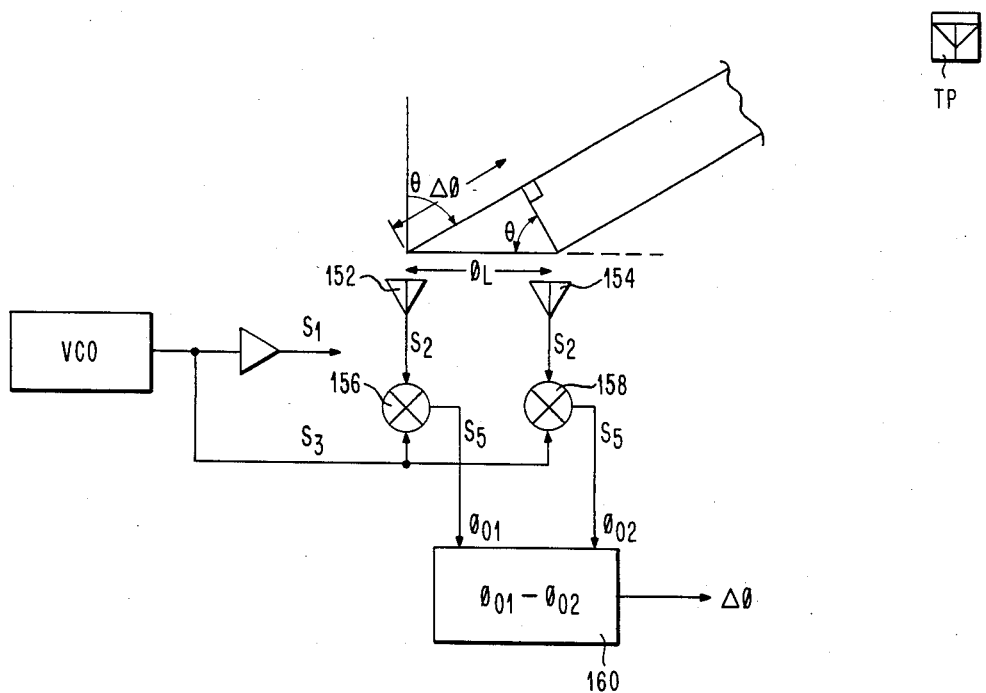
FIG. 23 is a topological diagram illustrating how the passive interrogator-transponder system of the present invention may be used to determine the bearing to a transponder.
Figure 24:
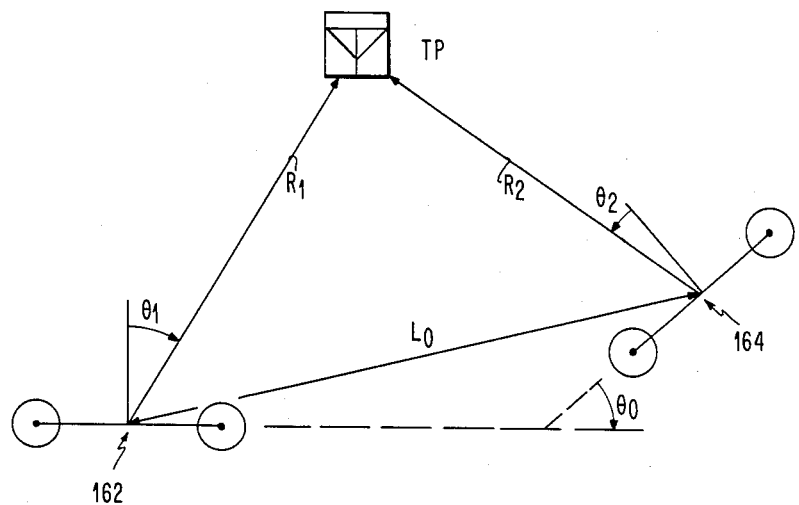
FIG. 24 is a topological diagram illustrating how the passive interrogator-transponder system according to the present invention may be used to determine the range to a transponder.

FIGS. 23 and 24 illustrate how plural transmitting and receiving systems may be employed to obtain range and bearing to a transponder TP. In FIG. 23, two transmitters, receivers and mixers are employed with antennae 152 and 154 disposed a distance L apart. The mixers 156 and 158 which receive the signals $S_2$ from the antennae 152 and 154, respectively, also receive a common signal $S_3$ derived from the transmitted signal $S_1$. The signals $S_5$ produced by these mixers contain the encoded phase information received from the transponder. By comparing a phase $\phi_{01}$ of the signal received at one antenna 152 with a phase $\phi_{02}$ of the signal received at the other antenna 154, for example by means of a comparator 160, it is possible to determine the difference in phase $\Delta\phi$.

From the geometry shown in FIG. 23 it may be seen that:

$$\theta = \tan^{-1} \Delta\phi/\phi_L$$

$$\phi_L = kL = 2\pi L/\lambda$$

$$\phi_L = 2\pi f L/c$$

It is thus possible to determine the bearing $\theta$ to the transponder.

FIG. 24 illustrates how two sets of apparatus of the type shown in FIG. 23 arranged at known locations, permits the determination of the respective ranges $R_1$ and $R_2$ to a transponder from these locations. In this case, a first bearing $\theta_1$ is determined by a first system 162 and a second bearing $\theta_2$ is determined by a second system 164. The ranges $R_1$ and $R_2$ may be computed from these angles $\theta_1$ and $\theta_2$ as well as the distance $L_0$ and the angle $\theta_0$ between these two systems 162 and 164.

There has thus been shown and described a novel system for interrogating a passive transponder which fulfills all the objects and advantages sought therefor. Many changes, modifications, variations and other uses and applications of the subject invention will, however, become apparent to those skilled in the art after considering this specification and the accompanying drawings which disclose preferred embodiments thereof. All such changes, modifications, variations and other uses and applications which do not depart from the spirit and scope of the invention are deemed to be covered by the invention which is limited only by the claims which follow.

What is claimed is:

1. System for interrogating a transponder carrying encoded information, said system comprising:
   (a) at least one transponder means for receiving a first signal and for transmitting a second signal in reply thereto, said transponder means including signal transforming means, coupled to receive said first signal as an input, for producing said second signal as an output, said signal transforming means including:
      (1) a plurality of signal conditioning means coupled to receive said first signal, each signal conditioning means providing an intermediate signal having a known delay and a known amplitude modification to said first signal; and
      (2) signal combining means coupled to all of said signal conditioning means, for combining said intermediate signals to produce said second signal, said signal conditioning means and said signal combining means imparting a known informational code to said second signal associated with said transponder means;
   (b) means for transmitting said first signal having a first frequency, said first frequency successively assuming a plurality of frequency values across a prescribed frequency range which is sufficiently wide to resolve the differences in time between the known delays of different ones of said signal conditioning means;
   (c) means for receiving said second signal from said transponder means;
   (d) means, coupled to said transmitting means, for producing a third signal derived from said first signal;
   (e) means, coupled to said receiving means, for producing a fourth signal derived from said second signal;
   (f) means, arranged to receive said third signal and said fourth signal for mixing together said third signal and said fourth signal, thereby to produce a fifth signal; and
   (g) signal processing means, responsive to said fifth signal, for detecting at least some of the frequencies contained in said fifth signal, thereby to determine said informational code associated with said transponder means.

2. The system defined in claim 1, wherein said transmitting means comprises means for generating said first frequency as a plurality of discrete frequency values within said prescribed frequency range.

3. The system defined in claim 1, wherein said transmitting means comprises means for generating said first frequency as a value which is swept in continuous manner from one side of said frequency range to the other.

4. The system defined in claim 1, wherein transmitting means comprises means for generating said first signal as electromagnetic radiation.

5. The system defined in claim 4, wherein said transmitting means is a radio transmitter and said frequency range lies within the radio frequency spectrum.

6. The system defined in claim 4, wherein said transmitting means is a coherent optical radiation source.

7. The system defined in claim 6, wherein said frequency range is in the infrared band.

8. The system defined in claim 1, wherein said transmitting means and said receiving means share a common antenna.

9. The system defined in claim 1, wherein said transmitting means includes switch means for intermittently interrupting the transmission of said first signal, thereby to provide repeated intervals for receiving said second signal.

10. The system defined in claim 9, wherein said switch means includes a clock signal generator and an electronic switch, responsive to said clock signal generator, for interrupting said first signal at the clock signal rate.

11. The system defined in claim 9, wherein said switch means alternatively supplies said first signal to said third signal deriving means when said signal is not transmitted by said transmitting means.

12. The system defined in claim 1, wherein said signal transforming means includes a substrate having a substrate surface defining a plurality of paths of travel for acoustic waves, each path of travel having a different length from its beginning to its end; and electric circuit means for propagating surface acoustic waves along said paths of travel, from said beginning of each path to said end thereof.

13. The system defined in claim 12, wherein said circuit means includes at least one launch transducer arranged on said surface for converting said first signal into surface acoustic waves which propagate along said paths of travel; a plurality of tap transducers arranged on said surface at spaced intervals along said paths of travel for converting said acoustic waves into output signals; and an electric circuit, coupled to said tap transducers, for combining said output signals to form said second signal.

14. The system defined in claim 13, wherein a plurality of transducer positions are provided along said path at substantially equal intervals, and wherein said tap transducers are disposed at at least some of said positions, the presence or absence of a tap transducer at a transducer position which is connected to said circuit means providing said informational code in said second signal.

15. The system defined in claim 12, further comprising a plurality of acoustic wave delay pads disposed on the surface of said substrate along said paths of travel to control the acoustic wave propagation time along said paths of travel.

16. The system defined in claim 15, wherein all of said delay pads have the same width in the direction of travel of the acoustic waves along said paths, whereby the presence or absence of a pad changes the propagation time of the acoustic waves by a prescribed amount.

17. The system defined in claim 15, wherein said delay pads are configured to modify the acoustic wave amplitude by a prescribed amount, wherein the acoustic wave amplitude provides at least a portion of said informational code in said signal.

18. The system defined in claim 12, wherein said substrate is a lithium niobate ($LiNbO_3$) crystal.

19. The system defined in claim 1, wherein said signal transforming means includes at least one optical waveguide defining a path of travel for optical waves, means for introducing optical waves at one end of said waveguide, and tap means for determining when the waves introduced at said one end of said waveguide reach points at spaced intervals along said waveguide.

20. The system defined in claim 19, wherein said optical waveguide comprises at least one optical fiber.

21. The system defined in claim 19, wherein said optical waveguide comprises an integrated optic waveguide.

22. The system defined in claim 19, wherein said tap means includes means for producing said second signal.

23. The system defined in claim 22, wherein said transmitting means transmits said first signal as a light beam.

24. The system defined in claim 23, wherein said tap means includes means for transmitting said second signal as light-frequency electromagnetic radiation.

25. The system defined in claim 23, wherein said tap means includes means for transmitting said second signal as radio-frequency electromagnetic radiation.

26. The system defined in claim 1, wherein said mixing means includes (1) heterodyning means for receiving said third and said fourth signals and producing an output signal with a frequency equal to the sum and the difference of the frequencies of said third and said fourth signals, respectively; and (2) a frequency filter, coupled to receive said output signal, for passing only the portion of said output signal containing the difference frequency, thereby forming said fifth signal.

27. The system defined in claim 1, wherein said fifth signal is an analog signal and wherein signal processing means includes an analog-to-digital converter for converting said fifth signal into a digital signal.

28. The system defined in claim 27, wherein said signal processing means further includes means, coupled to said analog-to-digital converter, for performing a fast fourier transform on said digital signal.

29. The system defined in claim 27, further comprising means for deriving a sampling signal, including:
(1) a signal delay element coupled to receive said first signal and to produce a sixth signal which is a delayed version of said first signal;
(2) second means for mixing together said first signal and said sixth signal, thereby to produce a seventh signal; and
(3) means responsive to said fifth signal and said seventh signal for sampling said fifth signal in dependence upon the frequency of said seventh signal.

30. The system defined in claim 29, wherein said second mixing means includes (1) heterodyning means for receiving said first and said sixth signals and producing an output signal with a frequency equal to the sum and the difference of the frequencies of said first and said sixth signals, respectively; and (2) a second frequency filter, coupled to receive said output signal, for passing only the portion of said output signal containing the difference frequency, thereby forming said seventh signal.

31. The system defined in claim 29, wherein said sampling means includes zero crossing detector means coupled to receive said seventh signal for producing a sampling signal in dependence upon the zero crossings of said seventh signal.

32. The system defined in claim 29, wherein said sampling means is arranged to provide samples of said fifth signal to said anlog-to-digital converter.

33. The system defined in claim 1, wherein said third signal producing means includes signal amplitude-modifying means, whereby said third signal has the same frequency as said first signal.

34. The system defined in claim 1, wherein said third signal producing means includes frequency-modifying means, whereby said third signal has a frequency which is derived from the frequency of said first signal.

35. The system defined in claim 1, wherein said fourth signal producing means includes signal amplitude-modifying means, whereby said fourth signal has the same frequency as said second signal.

36. The system defined in claim 1, wherein said fourth signal producing means includes frequency-modifying means, whereby said fourth signal has a frequency which is derived from the frequency of said second signal.

37. The system defined in claim 1, wherein each of said signal conditioning means includes means for providing said intermediate signal with a known and constant delay to said first signal.

38. The system defined in claim 1, wherein each of said signal conditioning means includes means for providing said intermediate signal with a known and constant amplitude modification to said first signal.

39. The system defined in claim 1, wherein each of said signal conditioning means includes means for providing said intermediate signal with a known and frequency-dependent delay to said first signal.

40. The system defined in claim 1, wherein each of said signal conditioning means includes means for providing said intermediate signal with a known and frequency-dependent amplitude modification.

41. The system defined in claim 1, wherein said signal processing means includes means for determining the respective amplitudes of each of the detected frequencies.

42. The system defined in claim 1, wherein said first frequency repetitively assumes said plurality of frequency values at different times, and wherein said signal processing means includes means for determining the respective phases of each of the detected frequencies at said different times; said system further comprising:
   (h) means for storing the respective phases determined for each of said detected frequencies at said different times, and
   (i) means for comparing said phases which are stored at said different times to detect changes in said phases, thereby to detect radial movement of said transponder means with respect to said transmitting means.

43. The system defined in claim 1, wherein said receiver means receives said second signal at at least two spaced locations, wherein said fourth signal producing means produces a plurality of fourth signals each derived from a respective one of said second signals; wherein said mixing means mixes together said third signal with each respective one of said fourth signals to produce a plurality of fifth signals; and wherein a said signal processing means, is responsive to each respective fifth signal for detecting the frequencies contained in said respective fifth signal and determining the phases of each of said detected frequencies;
   said system further comprising and phase comparison means for determining the difference in phase determined from said respective fifth signals, thereby to determine the bearing of said transponder means.

44. The system defined in claim 43, further comprising means for determining the bearing to said transponder means from two separated locations, and means responsive to the determined bearings for calculating the ranges to said transponder means from said separated locations.

45. The system defined in claim 1, wherein said signal combining means comprises signal mixer means for heterodyning signals together, whereby the frequency of said second signal is substantially different than the frequency of said first signal.

46. In a system for interrogating a plurality of transponders, each carrying encoded information, said system comprising:
   (a) at least one transponder for receiving a first signal and transmitting a second signal in reply thereto, said transponder comprising signal transforming means, coupled to receive said first signal as an input, for producing said second signal as an output, said signal transforming means including:
      (1) a plurality of signal delay means coupled to receive said first signal, each signal delay means providing an intermediate signal having a nominal, known delay time with respect to said first signal; and
      (2) signal combining means, coupled to at least some of said signal delay means, for combining at least some of said intermediate signals in a known manner to produce said second signal, said signal delay means and/or said signal combining means imparting a prescribed informational code to said second signal associated with said transponder;
   (b) interrogator/receiver means for transmitting said first signal to, and receiving said second signal from said at least one transponder; and
   (c) signal decoding and processing means, coupled to said interrogator/receiver means, for determining said informational code associated with each transponder;
   the improvement comprising a method for determining said informational code, said method comprising the steps of:
      (A) generating said first signal with a known first frequency, said first frequency successively assuming a plurality of frequency values across a prescribed frequency range which is sufficiently wide to resolve the differences in time between the known delays of different ones of said signal delay means;
      (B) transmitting said first signal;
      (C) receiving said second signal; and
      (D) determining the amplitudes of said second signal at a plurality of frequencies which are different from said first frequency of said first signal.

47. The improvement defined in claim 46, wherein said signal generating step includes the step of generating said first signal with a time variable frequency f(t) having, repeatedly and on the average, a monotonic variation.

48. The improvement defined in claim 47, wherein said signal generating step includes the step of generating said first signal with a plurality of discrete frequency values.

49. The improvement defined in claim 47, wherein said generating step includes the step of generating said first signal with a first frequency which is swept in a continuous manner from one side of the frequency range to the other.

50. The improvement defined in claim 46, wherein said determining step includes the steps of:
   (i) mixing said first and second signals together to produce a mixed signal containing mixed frequencies related to the frequencies of said first and second signals;
   (ii) determining the amplitudes of said mixed signal at a plurality of prescribed frequencies determined by said nominal, known delay times and said known first frequency.

51. The improvement defined in claim 46, wherein at least some of said signal delay means include means for selectively increasing said signal delay from said nominal, known delay by a prescribed amount, thereby to impart said prescribed informational code to said second signal.

52. The improvement defined in claim 51, wherein said determining step includes the steps of:
   (i) mixing said first and second signals together to produce a mixed signal containing mixed frequencies related to the frequencies of said first and second signals;
   (ii) determining the amplitudes and phases of said mixed signal at a plurality of prescribed frequencies determined by said nominal, known delay times and said known first frequency.

53. The improvement defined in claim 51, wherein said transponder includes:
   (i) a substrate having a substrate surface defining a plurality of paths of travel for acoustic waves, each path of travel having a different length from its beginning to its end; and (ii) electric circuit means for propagating acoustic waves along said paths of travel, from said beginning of each path to said end thereof.

54. The improvement defined in claim 53, wherein said circuit means includes at least one launch transducer arranged on said surface for converting said first signal into surface acoustic waves which propagate along said paths of travel; a plurality of tap transducers arranged on said surface at spaced intervals along said paths of travel for converting said acoustic waves into output signals; and an electric circuit, coupled to said tap transducers, for combining said output signals to form said second signal.

55. The improvement defined in claim 53, further comprising a plurality of acoustic wave delay pads disposed on the surface of said substrate along said paths of travel to control the acoustic wave propagation time along said paths of travel.

56. The system defined in claim 1, wherein said signal processing means includes means for determining the respective phases of each of the detected frequencies.

* * * * *